(12) United States Patent
Letertre et al.

(10) Patent No.: US 8,481,408 B2
(45) Date of Patent: Jul. 9, 2013

(54) RELAXATION OF STRAINED LAYERS

(75) Inventors: Fabrice Letertre, Meylan (FR); Carlos Mazure, Bernin (FR); Michael R. Krames, Los Altos, CA (US); Melvin B. McLaurin, Mountain View, CA (US); Nathan F. Gardner, Sunnyvale, CA (US)

(73) Assignee: Soitec, Bernin (FR)

( * ) Notice: Subject to any disclaimer, the term of this patent is extended or adjusted under 35 U.S.C. 154(b) by 0 days.

(21) Appl. No.: 13/458,587

(22) Filed: Apr. 27, 2012

(65) Prior Publication Data
US 2012/0214291 A1 Aug. 23, 2012

Related U.S. Application Data

(62) Division of application No. 13/056,572, filed as application No. PCT/EP2009/005694 on Aug. 6, 2009.

(30) Foreign Application Priority Data

Aug. 6, 2008 (EP) .................................. 08290757
Jul. 21, 2009 (EP) .................................. 09290577

(51) Int. Cl.
*H01L 21/30* (2006.01)

(52) U.S. Cl.
USPC ............ 438/458; 438/455; 438/457; 438/928

(58) Field of Classification Search
USPC ......................... 438/455–459, 928
See application file for complete search history.

(56) References Cited

U.S. PATENT DOCUMENTS

| | | | |
|---|---|---|---|
| 4,994,867 A | 2/1991 | Biegelsen | 357/16 |
| 5,391,257 A | 2/1995 | Sullivan et al. | 156/630 |
| 5,670,411 A | 9/1997 | Yonehara et al. | 437/62 |
| 5,965,939 A | 10/1999 | Kim et al. | 257/752 |
| 6,071,795 A | 6/2000 | Cheung et al. | 438/458 |
| 6,214,733 B1 | 4/2001 | Sickmiller | 438/691 |
| 6,406,795 B1 | 6/2002 | Hwang et al. | |

(Continued)

FOREIGN PATENT DOCUMENTS

| | | |
|---|---|---|
| EP | 0 651 439 A2 | 5/1995 |
| EP | 0 858 110 A1 | 8/1998 |

(Continued)

OTHER PUBLICATIONS

International Search Report dated Sep. 23, 2009, application No. PCT/EP2009/004790.

(Continued)

*Primary Examiner* — Hung Vu
*Assistant Examiner* — Bryan Junge
(74) *Attorney, Agent, or Firm* — Winston & Strawn LLP

(57) ABSTRACT

A method for relaxing a layer of a strained material. The method includes depositing a first low-viscosity layer on a first face of a strained material layer; bonding a first substrate to the first low-viscosity layer to form a first composite structure; subjecting the composite structure to heat treatment sufficient to cause reflow of the first low-viscosity layer so as to at least partly relax the strained material layer; and applying a mechanical pressure to a second face of the strained material layer wherein the second face is opposite to the first face and with the mechanical pressure applied perpendicularly to the strained material layer during at least part of the heat treatment to relax the strained material.

22 Claims, 3 Drawing Sheets

U.S. PATENT DOCUMENTS

| | | | |
|---|---|---|---|
| 6,562,127 B1 | 5/2003 | Kud et al. | |
| 6,794,276 B2 | 9/2004 | Letertre et al. | 438/506 |
| 6,946,373 B2 | 9/2005 | Agnello et al. | 438/509 |
| 7,018,909 B2 | 3/2006 | Ghyselen et al. | 438/455 |
| 7,273,798 B2 | 9/2007 | Lester et al. | 438/458 |
| 7,282,381 B2 | 10/2007 | Feltin et al. | 438/46 |
| 7,348,260 B2 | 3/2008 | Ghyselen | |
| 7,585,792 B2 | 9/2009 | Celler | 438/795 |
| 7,736,935 B2 | 6/2010 | Faure et al. | 438/59 |
| 7,981,767 B2 | 7/2011 | Guenard et al. | |
| 8,048,693 B2 | 11/2011 | Letertre et al. | |
| 8,058,663 B2 | 11/2011 | Fan et al. | 257/98 |
| 2003/0064535 A1 | 4/2003 | Kub et al. | 438/22 |
| 2004/0192067 A1 | 9/2004 | Ghyselen et al. | 428/763 |
| 2004/0253792 A1 | 12/2004 | Cohen et al. | 438/400 |
| 2005/0250294 A1 | 11/2005 | Ghyselen | 438/458 |
| 2006/0094140 A1 | 5/2006 | Inoguchi et al. | 438/22 |
| 2006/0128117 A1 | 6/2006 | Ghyselen et al. | 438/455 |
| 2006/0175608 A1 | 8/2006 | Celler | 257/49 |
| 2006/0205180 A1 | 9/2006 | Henley et al. | 438/458 |
| 2006/0211219 A1 | 9/2006 | Henley et al. | 438/458 |
| 2007/0048975 A1 | 3/2007 | Chen et al. | 438/478 |
| 2007/0069225 A1 | 3/2007 | Krames et al. | 257/94 |
| 2007/0072324 A1 | 3/2007 | Krames et al. | 438/46 |
| 2007/0241353 A1 | 10/2007 | Taki | 257/94 |
| 2007/0278622 A1 | 12/2007 | Lester et al. | 257/615 |
| 2007/0287273 A1 | 12/2007 | Boussagol et al. | 438/503 |
| 2007/0298549 A1 | 12/2007 | Jurczak et al. | 438/149 |
| 2008/0113496 A1 | 5/2008 | Keller et al. | 438/481 |
| 2008/0169483 A1 | 7/2008 | Kasai et al. | 257/183 |
| 2008/0211061 A1 | 9/2008 | Atwater Jr et al. | |
| 2008/0296609 A1 | 12/2008 | Nagahama et al. | 257/103 |
| 2009/0050917 A1 | 2/2009 | Nakagawa et al. | 257/98 |
| 2009/0261344 A1 | 10/2009 | Celler | 257/75 |
| 2010/0032793 A1 | 2/2010 | Guenard et al. | 257/507 |
| 2010/0032805 A1 | 2/2010 | Letertre et al. | 257/615 |
| 2011/0127640 A1 | 6/2011 | Faure | |
| 2011/0143522 A1 | 6/2011 | Letertre et al. | |
| 2011/0180911 A1 | 7/2011 | Guenard et al. | |

FOREIGN PATENT DOCUMENTS

| | | |
|---|---|---|
| EP | 1 378 591 A1 | 1/2004 |
| EP | 1 671 361 B1 | 6/2006 |
| EP | 1 901 345 A1 | 3/2008 |
| FR | 2 775 121 A1 | 8/1999 |
| FR | 2851847 | 9/2004 |
| FR | 2 895 420 A1 | 6/2007 |
| FR | 2 895 562 A1 | 6/2007 |
| JP | 2004-502298 A | 1/2004 |
| JP | 2006-186382 A | 7/2006 |
| JP | 2006-519488 A | 8/2006 |
| JP | 2006519488 | 8/2006 |
| JP | 2008004910 A | 1/2008 |
| WO | WO 02/01608 A2 | 1/2002 |
| WO | WO 2004/077552 A1 | 9/2004 |
| WO | WO 2006/086024 A1 | 8/2006 |

OTHER PUBLICATIONS

International Search Report dated Mar. 25, 2010, application No. PCT/EP2009/005694.

European Search Report dated Apr. 14, 2009, application No. EP 08290759.

European Search Report dated Mar. 16, 2009, application No. EP 08290757.7.

Di Cioccio et al., "III—V Layer Transfer Onto Silicon and Applications," Physica Status Solidi (A), 202(4):509-515 (2005).

Feng et al., "Stress Generation and Relaxation during Film Heteroepitaxy on a Compliant Substrate with a Viscoelastic Glass Interlayer," Mat. Res. Soc. Symp. Proc., 696:N3.19.1-N3.19.6 (2002).

Hansen et al., "Development of a glass-bonded compliant substrate," Journal of Crystal Growth, 195:144-150 (1998).

Hobart et al., "Compliant Substrates: A Comparative Study of the Relaxation Mechanisms of Strained Films Bonded to High and Low Viscosity Oxides," Journal of Electronic Materials, 29(7)897-901 (2000).

Huang et al., "Mechanics of Relaxing SiGe Islands on a Viscous Glass," Acta Mechanica Sinica (English Series), 18(5):441-456 (2002).

Huang et al., "Relaxation of a strained elastic film on a viscous layer," Mat. Res. Soc. Symp. Proc., 695:L3.14.1 (2002).

Kostrzewa et al, "Feasibility of strain relaxed InAsP and InGaAs compliant substrates," IEEE International Conference on Indium Phosphide and Related Materials, pp. 437-440 (2003).

Mooney et al., "Elastic strain relaxation in free-standing SiGe/Si structures," Applied Physics Letters, 84(7):1093-1095 (2004).

Moran et al., "Kinetics of Strain Relaxation in Semiconductor Films Grown on Borosilicate Glass-Bonded Substrates," Journal of Electronic Materials, 30(7):802-806 (2001).

Peng et al., "Influence of GaN polarity and intermediate-temperature buffer layers on strain relaxation and defects," Physica B, 391(1):6-11 (2007).

Yin et al., "Buckling Suppression of SiGe Islands on Compliant Substrates," Journal of Applied Physics, 94(10):6875-6882 (2003).

Yin et al., "Strain Relaxation of SiGe Islands on Compliant Oxide," Journal of Applied Physics, 91(12):9716-9722 (2002).

Yin et al., "Tunable uniaxial vs biaxial in-plane strain using compliant substrates," Applied Physics Letters, 87:061922-1-061922-3 (2005).

Yin et al., "Fully-depleted Strained-Si on Insulator NMOSFETs without Relaxed SiGe Buffers," IEEE International Electron Devices Meeting, pp. 03-53-03-56 (2003).

U.S. Appl. No. 12/341,722, filed Dec. 22, 2008.
U.S. Appl. No. 12/341,852, filed Dec. 22, 2008.
U.S. Appl. No. 13/055,123, filed Jan. 20, 2011.
U.S. Appl. No. 13/081,788, filed Apr. 7, 2011.
U.S. Appl. No. 12/341,722, Non-Final Office Action (Restriction Requirement) mailed Dec. 9, 2010.
U.S. Appl. No. 12/341,722, Non-Final Office Action mailed Mar. 2, 2011.
U.S. Appl. No. 12/341,722, Final Office Action mailed Jul. 15, 2011.
U.S. Appl. No. 12/341,722, Notice of Allowance mailed Sep. 2, 2011.
U.S. Appl. No. 12/341,852, Non-Final Office Action mailed Dec. 17, 2010.
U.S. Appl. No. 12/341,852, Final Office Action mailed Jan. 21, 2011.
U.S. Appl. No. 12/341,852, Notice of Allowance mailed Feb. 24, 2011.
U.S. Appl. No. 12/341,852, Notice of Allowance mailed Apr. 18, 2011.
Non-Final Office Action, U.S. Appl. No. 13/056,572, dated Apr. 11, 2012.
Final Office Action, U.S. Appl. No. 13/056,572, dated Sep. 21, 2012.

RELAXATION OF STRAINED LAYERS

CROSS-REFERENCE TO RELATED APPLICATIONS

This application is a division of application Ser. No. 13/056,572, filed Mar. 4, 2011, which is the 371 filing of International Patent Application PCT/EP2009/005694 filed Aug. 6, 2009. The entire content of each prior application is expressly incorporated herein by reference thereto.

FIELD OF INVENTION

The present invention relates to the field of strained layers and compliant substrates for application in the manufacture of semiconductor devices useful in electronic, optoelectronic, photovoltaic field and, in particular, to the relaxation of strained heteroepitaxial films by compliant substrates.

BACKGROUND OF THE INVENTION

The growth of thin films on substrates by heteroepitaxy is an important manufacturing step in the semiconductor technology. For instance, when native bulk substrates are not available or are too expensive, useful materials are often formed by heteroepitaxy on seed substrates. In the field of light-emitting semiconductor devices or solar cells there is a need to grow heteroepitaxial films of III/N materials on substrates as sapphire or SiC. However, when materials are formed by heteroepitaxy on substrates with a different lattice constants and different coefficients of thermal expansion as compared to the ones of the materials detrimental effects on material quality are caused by misfit compressive or tensile strain and the corresponding generation of dislocations and cracks. Thus, film of materials are formed by heteroepitaxy with a limited thickness such that neither crack nor dislocation occurred in the material. After transfer of the heteroepitaxial films to another substrate these films can, for instance, be used for epitaxial growth of layers used in electronic and opto-electronic, photovoltaic applications. However, thin heteroepitaxial films are strained due to the misfit of lattice parameter and the quality of epitaxial growth or subsequent steps can be deteriorated.

However, presently used methods for the relaxation of strained heteroepitaxial films on low-viscosity layers often not show satisfying results with respect to the suppression of buckling, the formation of cracks, etc. and complete in-plane relaxation can hardly be achieved. Thus, it is a problem underlying the present invention to provide a method for the complete or almost complete relaxation of a strained layer formed above a substrate that avoids or at least alleviates the above-mentioned defects.

SUMMARY OF THE INVENTION

The above-mentioned problem is solved by the present invention, which in one aspect relates to a method for relaxing a strained material layer which comprises the steps of depositing a first low-viscosity layer comprising a first compliant material on one face of the strained material layer; depositing a second low-viscosity layer comprising a second compliant material on another face of the strained material layer to form a first sandwiched structure; and subjecting the first sandwiched structure to a heat treatment such that reflow of the first and the second low-viscosity layers is caused thereby at least partly relaxing the strained material layer.

The term "low-viscosity" is used to indicate compliance and deformation ability of the thus specified layer during the heat treatment as discussed herein. In particular, the heat treatment at a temperature above the glass transition temperature results in some reflow or plastic deformation, e.g. due to some glass transition of the first and the second low-viscosity layers, thereby elastically relaxing the strained material layer. The provision of low-viscosity layers on both sides of the strained material layer allows in a free displacement of this strained material layer and, in particular, complete relaxation, if it is desired, without the formation of defects. Complete relaxation can be achieved by an appropriate choice of the temperature and duration of the heat treatment process.

A first substrate may be bonded to one of the first and the second low-viscosity layers before the step of subjecting the sandwich to the heat treatment. This first substrate might be advantageously used for transfer from a seed substrate on that the strained material layer was heteroepitaxially grown beforehand. Furthermore, a second substrate may be bonded to the other one of the first and the second low-viscosity layers before the step of heat treatment thereby forming a second sandwiched structure comprising both substrates, both low-viscosity layers and the strained material layer.

The second sandwiched structure comprising the first and the second substrates that may be made, e.g., of sapphire or some Si compound provides the advantage that buckling of the strained material layer during the relaxation heat treatment can reliably be prevented. In fact, the first and the second substrates act as almost infinite rigid mechanical stiffeners during the heat treatment that suppresses or significantly reduces surface buckling and allows a mainly lateral relaxation of the strained material layer. The dilatation of the substrates during the heat treatment may also participate to the relaxation of the strained material.

Preferably, the first and the second substrates are made of the same material or at least of materials of similar coefficients of thermal expansion in order to avoid a risk that the second sandwiched structure could break during the heat treatment due to a significantly different expansion on both sides of the strained material layer. The materials and the thicknesses of the substrates may advantageously be chosen such that the effect of mismatch between coefficients of thermal expansion is low enough at the reflow temperature so that the second sandwiched structure is mechanically stable during the heating to limit the risk of disassembling, cracks or splits of the substrates. The coefficients of thermal expansion of substrates may differ by not more than 20%, preferably by not more than 10% and even more preferably by not more than 5% at the reflow temperature. For example, the first and second substrates may be chosen from the couple of Si/SiC, GaAS/Ge, SiC/AlN or GaN/AlN.

Alternatively to bonding a second substrate to achieve the second sandwiched structure some (mechanical) pressure may be applied to the strained material layer to avoid or dampen wrinkles that may form during the heat processing (see also description below with reference to FIGS. 4 and 5). Thus, according to a further example instead of bonding the second substrate the method comprises applying a mechanical pressure, in particular, by a piston, to the other of the first and second low-viscosity layers (the low-viscosity layer to which the first substrate is not bonded) perpendicular to the faces of the strained material layer during at least part of the heat treatment. The pressure may be applied in an inhomogeneous manner across the strained material layer, in particular, such that the pressure varies linearly from one side of the other of the first and second low-viscosity layers to the other or is higher in the center than it is at the edges.

Application of an uniaxial pressure increases the energy associated with the bending of the strained material layer out of the nominal plane of the substrate (parallel to the above-mentioned faces of the strained material layer) and prevents the formation of stable wrinkle modes. Any wrinkles which do still exist in the strained material layer will have smaller amplitude and longer wavelength, compared to the case where no uniaxial pressure is applied. Thereby, the optoelectronic quality (due to spatial inhomogeneity) of AlInGaN films, for example, which may be subsequently deposited by epitaxial growth is significantly enhanced.

An uniaxial pressure can be applied to the strained material layer through a mechanical means, such as direct contact with a piston, or with another semiconductor wafer, or with a gas or liquid compressed by a piston. The pressure may be applied at low enough temperature such that the strained material layer is not wrinkled. The structure can be heated up to a temperature at which the borophosphosilicate glass (BPSG) or other low viscosity layer flows while the pressure is applied. It is possible to optimize the magnitude of the pressure, the rate at which the pressure is applied, the rate at which the temperature of the wafer is increased, and the duration of the high temperature and high pressure application in order to minimize the amplitude of the wrinkling, or increase the wavelength. The pressure may also be applied at high temperature, after the wrinkles have formed, linearly from one side to the other, or may be higher in the center and lower at the edges. This could be accomplished by applying the pressure with a piston that has a wedge or circular cross-section. Thus, suppressing wrinkles can be further optimized.

It is noted that in the examples wherein pressure is applied to the strained material layer via a low-viscosity layer by means of a piston, the low-viscosity layer may be deposited on the piston rather than the strained material layer. In any case it is preferred that the particular surface of the strained material layer and/or the surface of the piston or the surface of the stiffener that is applied to the surface of the strained material layer is relatively rough (e.g., above 1 nm roughness on a 1 by 1 micron scan) in order to avoid strong bonding between the low-viscosity layer and the strained material layer. Thus, after the heat treatment the piston and this low-viscosity layer can easily be removed from the relaxed strained material layer. The low-viscosity layer provided between the piston and the strained material layer particularly serves to avoid friction between the piston (or an equivalent tool) and the strained material layer and facilitates relaxation of the same.

According to a further example the pressure may be applied directly to the strained material layer without mediation by a low-viscosity layer. Alternatively, a stiffener, e.g., a wafer, may be laid on the strained material layer and the pressure is applied to the stiffener and thereby to the strained material layer during the heat treatment.

According to an embodiment the herein disclosed method also comprises detaching at least one of the first and second substrates and the low-viscosity layer to which it is bonded after the step of subjecting the sandwich to the heat treatment in order to expose at least one surface of the strained material layer. This exposed surface can subsequently be used for the further processing. In particular, it can be used for epitaxy of a layer useful for the manufacture of an electronic or optoelectronic semiconductor device or solar cells.

Furthermore, the strained material layer may be patterned before the heat treatment thereby forming strained material islands separated by interspaces. The formation of islands of the strained material layer further facilitates the relaxation process. The shapes of the strained material islands are arbitrary, in principle, and might be chosen to be circular, square or rectangular for ease of manufacture. Due to the provision of two low-viscosity layers covering the strained material islands at two major surfaces lateral dimensions of some tenth parts of a millimeter, e.g., about 0.5 mm, or even larger can be chosen for the islands without strongly affecting the relaxation effect as compared to the case of significantly smaller islands which are used in the art.

According to another example, the strained material layer is patterned before depositing the second low-viscosity layer or both the strained material layer and the second low-viscosity layer are patterned after depositing the second low-viscosity layer on the strained material layer. Thus, the formation of the strained material islands can be performed after transfer of the strained material layer to the first substrate and before the second low-viscosity layer is deposited on the strained material or trenches (interspaces) are formed through the second low-viscosity layer and the strained material layer in which case the bonding to the second substrate includes bonding of the islands structures and interspaces are maintained in the bonded structure. In each case, the first low-viscosity layer may also be partially or completely etch. These interspaces may be advantageous in achieving a completely relaxed strained material layer after the heat treatment.

The first and/or the second low-viscosity layers can be deposited in the form of buried oxide layers each being a compliant material layer. In addition, an $SiO_2$ layer or undoped silicon glass or a SiN layer may be deposited on the strained material layer in order to enhance the adherence of the low-viscosity layer to the strained material layer.

According to a particularly useful example the strained material layer comprises or consists of InGaN which is useful for the production of LEDs and solar cells, for instance. It should be noted, however, that InGaN represents only one example for the material of the strained material layer. In fact, the strained material layer may, for instance, comprise or consist of a III/N material, polar, semi-polar or non-polar, chosen from a binary, ternary quaternary alloy.

The first and/or the second low-viscosity layers may comprise or consist of BPSG or an $SiO_2$ compound comprising boron or phosphorous to cause elastically relaxation of the strained material layer due to reflow when heated above the glass transition temperature The heat treatment is advantageously performed at a temperature of at least 800° C., in particular, at least 850° C., in order to allow for complete relaxation of the strained material layer or the strained material islands with no substantially buckling, respectively. In the following the term "strained material" refers to the strained material layer or the islands formed from the strained material layer.

When the second sandwiched structure is subject to the heat treatment, annealing temperatures in the range of 850° C. to 950° C., in particular, 900° C. to 950° C., can be used for causing a high (fast) reflow of the compliant material, since the strained material is capped and shielded by the first and second substrates and, thus, damage of the strained material layer is prevented even at such high temperatures.

In order to achieve a sufficiently high reflow (plastic deformation) the first and/or second low-viscosity layer may preferably comprise some % of weight boron but less than 5% of weight boron, in particular, less than 4% of weight boron in order to guarantee sufficient reflow at high anneal temperatures from 850° C. up to 950° C. but a sufficient mechanical rigidity at lower temperatures (about 800° C.) involved in epitaxy on the relaxed strained material (see description below). In addition, phosphorous may be present at 1 to 3% by weight, in particular, 2 to 3% by weight.

In the above-described examples of the herein disclosed method for relaxing a strained material layer, the strained material layer, in particular, a strained InGaN layer, may be grown on a seed substrate, in particular, a massive or composite seed substrate with a GaN layer being deposited on a support substrate before the step of depositing the first low-viscosity layer that is the first compliant material on the strained material layer and the strained material layer can be detached from the seed substrate and bonded by the first low-viscosity layer to the first substrate before depositing the second low-viscosity layer that is the second compliant material on the strained material layer for bonding to the second substrate to form the second sandwiched structure. The detachment of strained layer from the seed substrate may be performed by the SMART CUT® technology, etching, laser lift off technique or any other suitable method. Thus, a heteroepitaxially grown strained material layer that was transferred to the first substrate can efficiently be relaxed in accordance with the present invention.

In case of polar strained materials, such that III-N materials and for example a c-plane InGaN material, the present invention has the advantage to easily allow the choice of the face of the InGaN material to free by the detachment of the first or the second substrate. Thus, one can free the III-polarity face as the Ga face for InGaN material after relaxation step that is particularly suitable for subsequent epitaxy.

Furthermore, the first low-viscosity layer and/or the second low-viscosity layer may comprise an absorption layer suitable for absorbing electromagnetic radiation in order to facilitate detachment after the heat treatment by means of laser lift off as know in the art. The material of the absorbing electromagnetic radiation may be for example SiN or other nitride compounds such as GaN and related compounds.

In the case of the provision of the absorption layer(s) it may be preferred that the absorption layer of the first low-viscosity layer is arranged at the interface of the first low-viscosity layer and the first substrate and/or the absorption layer of the second low-viscosity layer is arranged at the interface of the second low-viscosity layer and the second substrate in order to avoid damage of the at least partly relaxed strained material layer.

The herein disclosed method for relaxing a strained material layer in a elastic relaxation mode with substantially no buckling can advantageously be used for the production of semiconductor device for electronic, photovoltaic or optoelectronic applications. It is, therefore, provided a method for the manufacture of a semiconductor device, comprising the formation of at least partially relaxed strained material according to one of the examples described above, and further comprising epitaxially or homoepitaxially growing a material layer on the formed at least partially relaxed strained material, in particular, at least partially relaxed strained material islands, after removal of at least the first substrate together with the first low-viscosity layer or the second substrate together with the second low-viscosity layer.

Further, the invention provides a sandwiched structure after at least partial relaxation of strained material layer, in particular the at least partially relaxed strained layer is in InGaN and substrates are in sapphire.

The sandwiched structure is provided before and after at least partial relaxation of strained material islands in InGaN and includes trenches in both low viscosity layers, in particular, with the relaxed strained layer being InGaN and both substrates are sapphire or silicon.

Furthermore, the invention provides a sandwich structure, comprising in this order:
 a first substrate;
 a first low-viscosity layer;
 a strained material layer;
 a second low-viscosity layer; and
 a second substrate.

The strained material layer and the second low-viscosity layer are patterned into islands separated by interspaces and the first and the second low-viscosity layers have the property to reflow at a temperature above the glass transition temperatures of the first and the second low-viscosity layers.

BRIEF DESCRIPTION OF THE DRAWINGS

Additional features and advantages of the present invention will be described with reference to the drawings. In the description, reference is made to the accompanying figures that are meant to illustrate preferred embodiments of the invention. It is understood that such embodiments do not represent the full scope of the invention.

DETAILED DESCRIPTION OF THE INVENTION

Figure 1:
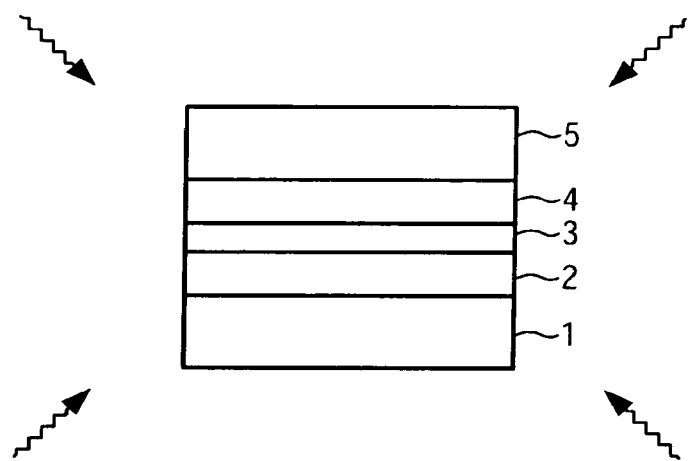
FIG. 1 illustrates an example of the inventive method for relaxing a strained material layer comprising the steps of forming a sandwiched structure comprising a borophosphosilicate glass above and below the strained material layer of InGaN and bonded to respective substrates and subjecting the sandwiched structure to heat treatment.

As shown in FIG. 1 according to an example of the present invention a multilayer stack representing a sandwiched structure is formed and subject to heat treatment (indicated by the arrows). The sandwiched structure comprises a first substrate 1, a first borophosphosilicate glass layer 2, a strained material layer 3, a second borophosphosilicate glass layer 4 and a second substrate 5.

Thus, in particular, the strained material layer 3 is sandwiched by two low-viscosity compliant borophosphosilicate glass layers 2 and 4.

The two low-viscosity compliant borophosphosilicate glass layers 2 and 4 allow for reliable complete elastic relaxation of the strained material layer 3 and the two substrates, which in the present example may be sapphire substrates, act as stiffeners to avoid any significant buckling of the strained material layer 3.

In the present example, the strained material layer 3 may be a c-plane InGaN film that was heteroepitaxially grown on a GaN seed layer deposited on some support substrate and transferred to the first substrate 1 by means of the first borophosphosilicate glass layer 2. The InGaN film may comprise 0.5 to 30% of molar indium and the thickness of the InGaN film may be chosen from 10 to 300 nm. Preferably, the InGaN film comprises about 5-7% of molar indium for a thickness of the film of about 100 nm.

In order to enhance the adherence between the strained material layer 3 and the first borophosphosilicate glass layer 2 an SiO$_2$ layer of a thickness of 10-100 nm may be deposited on the strained material layer 3, e.g., the InGaN film, before deposition of the first borophosphosilicate glass layer 2. After transfer to the first substrate 1 the second borophosphosilicate glass layer 4 is deposited on the free surface of the strained material layer 3, i.e. on the N face of the InGaN film. Again, an SiN film may be formed on the N face of the InGaN film before deposition of the second borophosphosilicate glass layer 4 in order to improve adherence. The second substrate was bonded to the second borophosphosilicate glass layer 4.

Both borophosphosilicate glass layers may be formed of the same material to avoid stresses or other asymmetric influences on the strained material layer 3 caused by different reflow properties during the heat treatment. The first and second borophosphosilicate glass layers 2 and 4 may comprise 4-5% of weight of boron and can appropriately have thicknesses of 0.5 micrometer up to a few micrometers. The greater the thicknesses of the respective borophosphosilicate glass layers 2 and 4 are chosen, the faster the relaxation of the strained material layer 3 will be achieved.

The sandwich structure shown in FIG. 1 is annealed at a temperature of about 800° C. to 950° C. Fast reflow of the compliant material is expected at such high temperatures that can be employed, since the InGaN film is protected by the first and second substrates 1 and 5.

Consider, for instance, a 1% strained InGaN film (i.e. a lattice mismatch between the grown InGaN film and the GaN seed layer on which it was grown of about 1%). For this case, a sample of 1 mm$^2$ has to laterally extend 10 micrometers in total in order to arrive at a completely relaxed state. This will be achieved by heat treatment of the sandwich structure shown in FIG. 1 at temperatures exceeding 850° C. without causing any significant buckling of the relaxed strained material layer 3.

According to other examples, the strained material layer 3 is patterned by etching trenches (interspaces) in the layer thereby forming strained material islands. In the sandwiched structure shown in FIG. 2 the continuous strained material layer 3 of FIG. 1 was etched to form trenches before the deposition of the second borophosphosilicate glass layer 4. After the second borophosphosilicate glass layer 4 was deposited on the strained material it fills the trenches completely. Apart from the step of patterning of the strained material layer 3 the manufacture of the sandwiched structure is the same as the one described with reference to FIG. 1.

Figure 2:
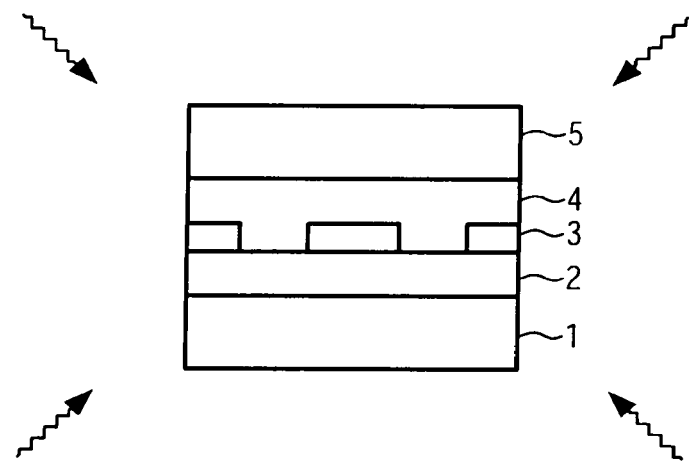
FIG. 2 illustrates another example of the inventive method for relaxing a strained material layer wherein the strained material layer is patterned thereby forming islands and trenches filled by a compliant material layer.
Figure 3:
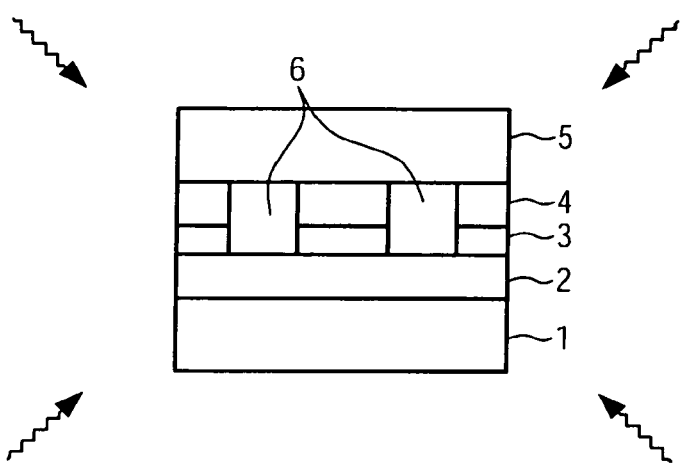
FIG. 3 illustrates another example of the inventive method for relaxing a strained material layer wherein the strained material layer is patterned thereby forming islands and open interspaces.

Another example of a multilayer stack comprising a strained material layer that is to be relaxed by compliant material during heat treatment is shown in FIG. 3. In this example, the second borophosphosilicate glass layer 4 was deposited on the continuous strained material layer 3 of FIG. 1 and subsequently both the second borophosphosilicate glass layer 4 and the strained material layer 3 was patterned by etching trenches or interspaces 6. The borophosphosilicate glass layer 2 may also be partially or completely etched depending on the ability of the strained material to relax. Apart from this etching process, again, the manufacture of the sandwiched structure is the same as the one described with reference to FIG. 1. Compared to the example shown in FIG. 2 relaxation of the strained material islands 3 is not hindered by any material of the second borophosphosilicate glass layer 4 that was filled into the trenches.

After the relaxation of the strained material layer 3 of FIG. 1 or the strained material islands shown in FIGS. 2 and 3, i.e. after termination of the heat treatment and cool down of the sandwiched structure, the first substrate 1 and the first borophosphosilicate glass layer 2 can be detached in order to get access to the Ga face of the relaxed strained InGaN film (islands) that can be used for (homo)epitaxially growth of an InGaN layer, for example.

Advantageously, the boron content of the second borophosphosilicate glass layer 2 is below some 4 to 5% of weight such that a sufficiently high reflow (plastic deformation) can be achieved during the heat treatment at temperatures above 850° C. but concurrently a sufficient rigidity is provided at temperatures that are involved in the epitaxial growth, e.g., about 800° C.

The epitaxy can be performed with relaxed InGaN material of (approximately) the same indium content as the relaxed strained material 3 of FIGS. 1 to 3. Depending on the quality of the crystallinity of the InGaN seed layer epitaxially grown layers on the relaxed strained material 3 with a dislocation density of about $5 \times 10^5$ to $5 \times 10^9$ cm$^2$ with a thickness of 1 to 3 micrometers can be obtained.

According to an alternative embodiment different from the example shown in FIG. 3, trenches in both layers 2 and 4 might be provided and even be preferred in view of the relaxation step. It also possible to partially etch the second borophosphosilicate glass layer 2.

Figure 4:
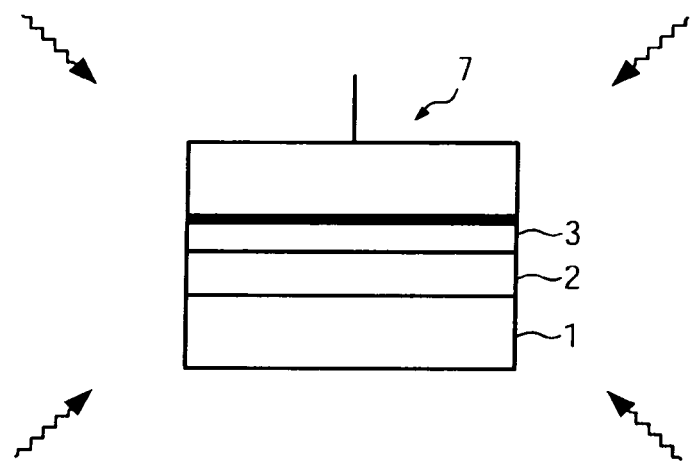
FIG. 4 illustrates an example of the inventive method for relaxing a strained material layer wherein external mechanical pressure is applied by some pressure means to the strained material layer during heat processing.

Another example for the herein disclosed inventive method is illustrated in FIG. 4. As in the embodiment described with reference to FIG. 1 a multilayer stack representing a sandwiched structure is formed and subject to heat treatment (indicated by the arrows). The sandwiched structure, however, only comprises a first substrate 1, a first borophosphosilicate glass layer 2 and a strained material layer 3 in this order. During the heat treatment mechanical pressure is applied to the strained material layer 3 by some mechanical pressure means 7, e.g., a piston 7, or a piston 7 directed onto a stiffener laid on the strained material layer 3 or a pressurized gas or liquid.

Figure 5:
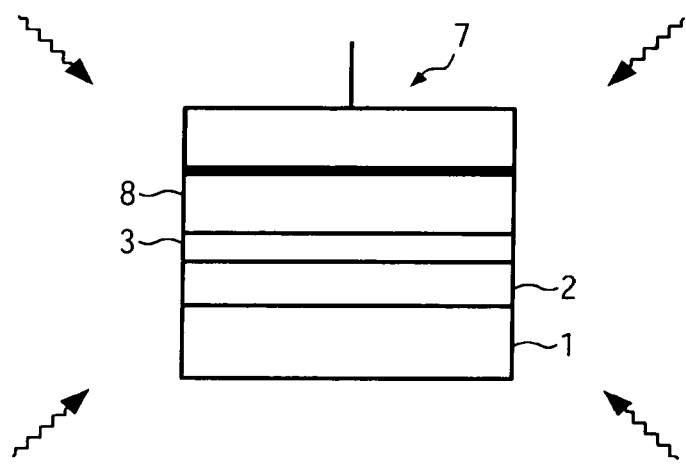
FIG. 5 illustrates an example of the inventive method for relaxing a strained material layer comparable to the one shown in FIG. 4 but with a borophosphosilicate glass layer or a stiffener provided for mediating the application of the pressure.

As shown in FIG. 5, another borophosphosilicate glass layer 8 may be deposited on the strained material layer 3 or on a piston 7 or on a stiffener laid on the strained material layer, e.g., a wafer may be laid on the strained material layer 3 trough the borophosphosilicate glass layer 8 and the piston 7 applies pressure to the strained material layer 3 via the other borophosphosilicate glass layer 8 and/or the stiffener. The borophosphosilicate glass layer 8 may alternatively be deposited on the piston 7 rather than the strained material layer 3 before application of pressure to the strained material layer 3. The surface of the strained material layer 3 that is opposite to the one bonded to first substrate and/or the surface of the piston 7 and/or the surface of the stiffener that are applied to the strained material layer 3 may be provided with a relatively rough surface e.g. above 1 nm roughness on a 1 by 1 micron scan for facilitating detachment after the heat treatment. Moreover, for accurate control of the application of the pressure a piston 7 with a wedge-like or circular cross-section may be preferred.

In any case, the formation of wrinkles in the strained material layer 3 during the heat treatment is reliably suppressed by the application of pressure by the pressure means 7.

All previously discussed embodiments are not intended as limitations but serve as examples illustrating features and advantages of the invention. It is to be understood that some or all of the above described features can also be combined in different ways.

What is claimed is:

1. A method for relaxing a layer of a strained material which comprises:
   depositing a first low-viscosity layer on a first face of a strained material layer;
   bonding a first substrate to the first low-viscosity layer to form a first composite structure;
   depositing a second low-viscosity layer on a stiffener that is arranged over a face of the strained layer but not bonded thereto;
   subjecting the composite structure to heat treatment sufficient to cause reflow of the first low-viscosity layer so as to at least partly relax the strained material layer;
   applying a first mechanical pressure to a second face of the strained material layer wherein the second face is opposite to the first face and with the mechanical pressure applied perpendicularly to the strained material layer during at least part of the heat treatment; and
   applying a second mechanical pressure in a direction that is opposite to that of the first mechanical pressure with the second mechanical pressure applied perpendicularly to the strained material layer during at least part of the heat treatment, wherein the mechanical pressure assists in the suppression of wrinkles in the strained material layer.

2. The method according to claim 1, which further comprises depositing the second low-viscosity layer on the stiffener before applying the second mechanical pressure to the stiffener wherein the stiffener assists in the relaxation of the strained material layer during heat treatment.

3. The method according to claim 2, wherein either of the first and second mechanical pressures, or both, are applied by a piston having a contact surface for contacting the first substrate or stiffener, and the method further comprises providing the contact surface of one or both pistons or the stiffener with a surface roughness above 1 nm on a 1 by 1 micron scan.

4. The method according to claim 1, which further comprises applying the first mechanical pressure to the stiffener in a direction perpendicular to the face of the strained material layer during at least part of the heat treatment, wherein the stiffener assists in the relaxation of the strained material layer during heat treatment.

5. A method for relaxing a layer of a strained material according to claim 1, which comprises:
   depositing a first low-viscosity layer on a first face of a strained material layer;
   bonding a first substrate to the first low-viscosity layer to form a first composite structure;
   subjecting the composite structure to heat treatment sufficient to cause reflow of the first low-viscosity layer so as to at least partly relax the strained material layer;
   applying a mechanical pressure to a second face of the strained material layer wherein the second face is opposite to the first face and with the mechanical pressure applied perpendicularly to the strained material layer during at least part of the heat treatment; and
   depositing a second low-viscosity layer on the second face of the strained-material layer to form a sandwich structure prior to applying the mechanical pressure so that the second low-viscosity layer helps to at least partly relax the strained material layer.

6. The method according to claim 5, wherein the composite structure is subjected to the heat treatment to cause reflow of both the first and second low-viscosity layers so as to at least partly relax the strained-material layer within the first sandwich structure.

7. The method according to claim 6, wherein the mechanical pressure is applied inhomogeneously across the first sandwiched structure.

8. The method according to claim 7, wherein the mechanical pressure is applied to vary linearly from one side of the other of the first and second low-viscosity layers to the other side.

9. The method according to claim 7, wherein the mechanical pressure is applied to be higher in the center of the other of the first and second low-viscosity layers than at the edges.

10. The method according to claim 5, which further comprises bonding a second substrate to the second low-viscosity layer to form a second composite structure, and wherein the mechanical pressure is applied by a piston having a contact surface for contacting the first or second substrates to assist in the suppression of wrinkles in the strained material layer during the heat treatment.

11. The method according to claim 10, which further comprises providing the contact surface of the piston or the second face of the strained layer with a surface roughness above 1 nm on a 1 by 1 micron scan.

12. A method for relaxing a layer of a strained material which comprises:
   depositing a first low-viscosity layer on a first face of a strained material layer;
   bonding a first substrate to the first low-viscosity layer to form a first composite structure;
   subjecting the composite structure to heat treatment sufficient to cause reflow of the first low-viscosity layer so as to at least partly relax the strained material layer;
   applying a mechanical pressure to a second face of the strained material layer wherein the second face is opposite to the first face and with the mechanical pressure applied perpendicularly to the strained material layer during at least part of the heat treatment;
   depositing a second low-viscosity layer on at least one surface of a second substrate, arranging the second low viscosity layer to face the second face of the strained material layer; and
   applying a second mechanical pressure to the second substrate in a direction that is opposite to that of the first mechanical pressure with the second mechanical pressure applied perpendicularly to the strained material layer during at least part of the heat treatment, wherein the mechanical pressure assists in the suppression of wrinkles in the strained material layer.

13. The method according to claim 12, wherein either of the first and second mechanical pressures, or both, are applied by a piston having a contact surface for contacting the first substrate or second substrate, and the method further comprises providing the contact surface of one or both pistons or the first or second substrate with a surface roughness above 1 nm on a 1 by 1 micron scan.

14. A method for relaxing a layer of a strained material which comprises:
   depositing a first low-viscosity layer on a first face of a strained-material layer;
   depositing a second low-viscosity layer on a second face of the strained-material layer to form a sandwich structure;
   bonding a first substrate to one of the first or the second low-viscosity layers to form a composite structure;
   subjecting the composite structure to heat treatment sufficient to cause reflow of one or both of the first and the second low-viscosity layers so as to at least partly relax the strained -material layer within the first sandwich structure; and applying a mechanical pressure to the other of the first and second low-viscosity layers in a direction perpendicular to the strained material layer during at least part of the heat treatment to assist in the relaxation of the strained material layer.

15. The method according to claim 14 which further comprises bonding a second substrate to the second low-viscosity layer to form a second composite structure, wherein the first and the second substrates have coefficients of thermal expansion that differ from each other by less than 10%.

16. The method according to claim 15 which further comprises, after performing the heat treatment, detaching at least one of the first and second substrates and the low-viscosity layer that is bonded thereto in order to expose at least one surface of the at least partly relaxed strained-material layer.

17. The method according to claim 15, wherein one or both of the low-viscosity layers comprise an absorption layer suitable for promoting the detachment of the substrate bonded thereto.

18. The method according to claim 14 which further comprises, before performing the heat treatment, patterning the strained-material layer so as to form separated islands of strained-material at least a majority of which have lateral dimensions larger than 0.25 mm$^2$.

19. The method according to claim 18, wherein patterning is performed prior to depositing the second low-viscosity layer.

20. The method according to claim 18, wherein patterning is performed subsequent to depositing the second low-viscosity layer on the strained-material layer, and wherein both the strained-material layer and the second low-viscosity layer are jointly patterned.

21. The method according to claim 14, wherein the strained-material layer comprises a Group III-nitride material or an alloy or mixture thereof; one or both of the low-viscosity layers comprise a composition or mixture including SiO$_2$ and one or both of boron and phosphorous with the composition comprising less than 5% by weight of boron.

22. The method according to claim 14, wherein at least a portion of the heat treatment is performed at a temperature of 850° C. or greater.

* * * * *